(12) United States Patent
Kwan

(10) Patent No.: US 8,587,765 B2
(45) Date of Patent: Nov. 19, 2013

(54) OPTICAL IMAGING DEVICE WITH DETERMINATION OF IMAGING ERRORS

(75) Inventor: Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1029 days.

(21) Appl. No.: 12/158,340

(22) PCT Filed: Dec. 21, 2006

(86) PCT No.: PCT/EP2006/070119
§ 371 (c)(1),
(2), (4) Date: Oct. 24, 2008

(87) PCT Pub. No.: WO2007/074134
PCT Pub. Date: Jul. 5, 2007

(65) Prior Publication Data
US 2009/0091727 A1    Apr. 9, 2009

Related U.S. Application Data

(60) Provisional application No. 60/753,718, filed on Dec. 23, 2005.

(30) Foreign Application Priority Data

Dec. 23, 2005  (DE) .......................... 10 2005 062 618

(51) Int. Cl.
*G03B 27/54*    (2006.01)
*G03B 27/68*    (2006.01)
*G03B 27/42*    (2006.01)

(52) U.S. Cl.
USPC .................. 355/67; 355/52; 355/53

(58) Field of Classification Search
USPC .......................... 355/67, 53, 52, 77
See application file for complete search history.

(56) References Cited

U.S. PATENT DOCUMENTS 6,360,012 B1    3/2002  Kreuzer
6,975,387 B2   12/2005  Mizuno
(Continued)

FOREIGN PATENT DOCUMENTS

EP    1 063 570    12/2000
EP    1 213 618     6/2002
(Continued)

OTHER PUBLICATIONS

English Translation and Written Opinion of the International Search Authority, for corresponding PCT Application No. PCT/EP2006/070119, dated Jun. 23, 2008.
(Continued)

*Primary Examiner* — Peter B Kim
(74) *Attorney, Agent, or Firm* — Fish & Richardson P.C.

(57) ABSTRACT

In some embodiments, the disclosure provides a system that includes an optical element group including a plurality of optical elements configured to project a pattern of an object in an object plane to an image plane. The system also includes a unit configured to detect an image selected from an image of at least part of the projection the pattern of the object, and an image of a measurement element arranged in the area of the object. The image is created via at least some of the optical elements in the optical element group. The unit is configured to determine an imaging error in the projection of the pattern of the object from the object plane to the image plane. The device is configured to be used in microlithography.

28 Claims, 4 Drawing Sheets

(56) References Cited

U.S. PATENT DOCUMENTS

| | | | |
|---|---|---|---|
| 2002/0041377 A1 | 4/2002 | Hagiwara et al. | |
| 2003/0091913 A1* | 5/2003 | Shiode | 430/22 |
| 2003/0234993 A1 | 12/2003 | Hazelton et al. | |
| 2005/0031969 A1 | 2/2005 | Finders et al. | |
| 2005/0112475 A1 | 5/2005 | Sato et al. | |
| 2005/0231698 A1* | 10/2005 | Monshouwer et al. | 355/53 |
| 2007/0076180 A1* | 4/2007 | Tinnemans et al. | 355/53 |

FOREIGN PATENT DOCUMENTS

| | | |
|---|---|---|
| JP | 2000-100697 | 4/2000 |
| JP | 2000-121498 | 4/2000 |
| JP | 2001-057337 | 2/2001 |
| JP | 2001-274059 | 10/2001 |
| JP | 2002-014005 | 1/2002 |
| JP | 2004-014876 | 1/2004 |
| JP | 2009-063923 | 3/2009 |
| TW | 1241396 | 10/2005 |
| TW | 1243408 | 11/2005 |
| WO | WO 99/60361 | 11/1999 |
| WO | WO 02/052620 | 7/2002 |

OTHER PUBLICATIONS

English Translation and International Preliminary Report on Patentability, for corresponding PCT Application No. PCT/EP2006/070119, dated Jun. 24, 2008.

Laan, van der H et al., "Aerial image measurement method for fast aberration set-up and illumination pupil verification," SPIE, 4346:394-407, 2001.

English translation and Korean Office Action, for the corresponding Korean Patent Application No. 10-2008-7018181, dated Sep. 12, 2012.

Japanese Office Action, and translation thereof, for corresponding JP Appl No. 2008-546473, dated Mar. 18, 2013.

Korean Office Action, and translation thereof, for corresponding KR Appl No. 10-2008-7018181, dated Mar. 7, 2013.

Office Action received in Taiwanese counterpart application serial No. 095148436 with Taiwanese associate comments, and English language translation thereof, dated Mar. 27, 2013.

* cited by examiner

OPTICAL IMAGING DEVICE WITH DETERMINATION OF IMAGING ERRORS

CROSS-REFERENCE TO RELATED PATENT APPLICATIONS

The present patent application is a continuation under 35 U.S.C. 120 of international patent application serial number PCT/EP2006/070119, filed Dec. 21, 2006, which under 35 U.S.C. 119(e)(1) claims the benefit of U.S. Provisional Application No. 60/753,718, filed Dec. 23, 2005, and German Application No. 10 2005 062 618.1, filed Dec. 23, 2005. The present application incorporates by reference the entire contents of both international patent application serial number PCT/EP2006/070119 and U.S. Provisional Application No. 60/753,718.

BACKGROUND OF THE INVENTION

The present invention relates to an optical imaging device. The invention may be put to use in the context of microlithography which is used in the manufacture of microelectronic circuits. Accordingly, the invention also relates to a mask for use in this type of optical imaging device. Lastly, the invention relates to a method for determining an imaging error as well as to an imaging process that makes use of said method.

Particularly in the realm of microlithography, it is necessary among other things, and besides using components made with the highest precision possible, that the components of the imaging device, i.e. for example the optical elements such as lenses or mirrors, be positioned as precisely as possible in order to achieve a commensurately high image quality. The exacting quality requirements, which lie in the microscopic range in the order of magnitude of a few nanometers or less, are to a large extent a consequence of the continuing need to increase the resolution of the optical systems used in the manufacture of microelectronic circuits, in order to advance the miniaturization of the microelectronic circuits that are to be produced.

With the increased resolution which is normally accompanied by a shift to shorter wavelengths of the light being used, not only is a higher accuracy required in the positioning of the optical elements being used, but of course the requirements in regard to minimizing the imaging errors of the entire optical system are also increased.

In view of the short operating wavelengths in the UV range which are used in microlithography, for example operating wavelengths around 193 nm, but also in particular in the so-called extreme UV range (EUV) with operating wavelengths around 13 nm, it is often proposed, in order to satisfy the stringent requirements imposed on the positioning of the individual components, that the positions of individual components such as the mask table, the optical elements and the substrate table (for example a wafer table) be determined individually relative to a reference, for example a reference structure, which is often established in a so-called metrology frame, and that these components then be actively positioned relative to each other.

This solution has on the one hand the disadvantage that normally no real-time measurement of the position of the projection pattern of the mask on the substrate (in most cases a wafer) takes place, but that the relative positions of the components and the position of the image are only indirectly arrived at from the individual position data of the components relative to the reference. The respective measurement errors will add up cumulatively, possibly leading to a relatively high total measurement error. Furthermore, this involves a large number of elements that have to be actively positioned, all of which have to be set and controlled in their positions with the required angular accuracy in the nanorad (nrad) range and a translatory position accuracy in the picometer (pm) range. This further entails particularly severe requirements on the thermal stability of the reference and the supporting structure for the optical elements. Normally, only a few dozen nanometers per degree Kelvin (nm/K) can be tolerated here for the thermal expansion.

On the other hand, there are further a number of solutions known, where the position of the image of the projection pattern of the mask on the substrate is determined in real time. The position of the image of the projection pattern on the substrate can be corrected here with significantly fewer active elements, possibly even with only one active element. This simplifies not only the dynamic control of the rest of the components, the requirements to be imposed on the thermal stability of the reference and the supporting structure for the optical elements are also markedly less severe.

The real-time determination of the position of the image of the projection pattern of the mask on the substrate is often performed according to the so-called laser pointer principle. This involves directing a collimated laser beam along a path starting from a light source arranged in the area of the mask and proceeding near the path of the image-producing light through the optical elements participating in the formation of the image all the way to the area of the substrate, and to capture the laser beam with a detector in that place. Even the smallest deviation of the optical elements from their correct position will now cause a deflection of the laser beam from its target position which is registered through the detector and used to make a correction. A method of this kind has been disclosed for example in US 2003/0234993 A1 (Hazelton et al.).

With this arrangement it is possible, due to the fact that the laser beam is directed through the optical elements participating in the formation of the image, to determine not only possible deviations from the correct position of the image of the projection pattern of the mask on the substrate, but to also register other errors in the image (for example distortions, etc.). All of these position errors and other errors are herein collectively referred to as imaging errors.

The foregoing solution again has the disadvantage that the positioning of the light source and the detector are subject to correspondingly stringent requirements in regard to angular accuracy in the nanorad range (nrad) and translatory accuracy in the picometer range (pm) as well as in regard to thermal stability. Most of all, the light source normally has to be supported by an elaborate thermally stable supporting structure which is normally arranged far from the reference (for example in a so-called metrology frame). In addition, expensive measures are again necessary to determine the positions of these components relative to a reference, with the result also entering into the calculation of the correction.

SUMMARY OF THE INVENTION

It is therefore the object of the present invention to provide an optical imaging device, a mask for the latter, a method for the determination of imaging errors, and an imaging process, in which the aforementioned disadvantages are absent or at least exist only to a smaller extent, and whereby in particular imaging errors can be corrected and, if applicable, a correction of imaging errors can be determined in the most direct way possible, in a simple manner, and in real time.

The present invention has the further objective to provide an optical imaging device, a mask for the latter, a method for the determination of imaging errors, and an imaging process, whereby imaging errors can be determined in the most direct way possible and, if applicable, can be corrected with a small number of elements.

The present invention is based on the observation that such a direct determination and, if applicable, a correction of imaging errors can be carried out in a simple way if a determination of the position of the mask is made from a location near the substrate through at least a large part of the first optical element which participate in the projection of the image of the projection pattern of the mask on the substrate, or through second optical elements which are functionally connected to the first optical elements. To accomplish this according to the invention, a measurement image is generated of a measurement element that is located in the area of the mask or in the area of the projection pattern by projecting said measurement element through at least a major part of the first optical elements which participate in the formation of the image of the projection pattern of the mask on the substrate, or through second optical elements which are functionally connected to the first optical elements, and by evaluating said measurement image in order to determine the imaging errors.

Using a measurement element has the advantage that it can be brought into an appropriately defined and stable position relative to the mask or its projection pattern in a straightforward way which requires only a small effort and expense, unlike the laser pointer methods of the prior art, where the active light source has to be appropriately defined and stably positioned. With the inventive concept, it is possible in particular to place a passive measurement element in a simple manner directly at the mask or in the immediate proximity of the projection pattern. However, in addition or as an alternative to using such a measurement element, it is also possible to use at least a part of the projection pattern for the measurement image.

This possibility of capturing the measurement image, and thus among other things the mask position in the immediate proximity of the substrate has a number of advantages. For example, any errors (position errors, dynamic errors, thermal errors, etc.) which originate from the optical elements, the mask device, the substrate device, or a reference, are removed. The measurement image which is captured in this way in most cases represents with good approximation the actual image of the projection pattern on the substrate, so that an appropriate correction can be made on this basis. If necessary, the difference between the measurement image capturing position and the substrate position can be determined and taken into account in a simple manner through a reference measurement of the measurement image capturing position in relation to the substrate position. Furthermore and besides, it is also possible with this arrangement to correct any enlargement error of the optical element group as well as any scale error of further reference measurement systems automatically, possibly in a single step.

A correction of the imaging errors that have been determined in this manner can be made simply by way of at least one of the components that participate in the projection. Thus, the correction can possibly be effected by using only one of the actively controllable components that participate in the projection of the image. Preferably, this is a component which is controllable within a large bandwidth. It is also possible here that the actively controllable component is constituted by the substrate device itself. However, one of the optical elements can function as the actively controllable component. In some cases it is also possible to envision an appropriate automatic regulation of the correction process which adapts the correction of the imaging errors to changing boundary conditions.

The present invention therefore has as one of its subjects an optical imaging device, in particular for use in microlithography, with a mask device serving to receive a mask containing a projection pattern, with an optical element group, a substrate device serving to receive a substrate and a measuring device. The optical element group includes a plurality of optical elements and is designed to project an image of the projection pattern onto the substrate. The measuring device is designed to determine at least one imaging error which occurs in the projection of the projection pattern on the substrate. The measuring device further includes a detecting device, wherein the detecting device serves to capture or detect a measurement image of at least a part of the projection pattern and/or of at least one measurement element that is located in the area of the mask device, which measurement image is generated through at least a major part of the optical elements of the optical element group, and wherein the measuring device is designed for the determination of the imaging error through the use of the measurement image.

A further subject of the present invention is a mask for an optical imaging device according to the invention, which mask includes the projection pattern and the measurement element.

A further subject addressed by the invention is an imaging method, in particular for microlithography, wherein a projection pattern is projected onto a substrate by means of the optical elements of an optical element group, and wherein the imaging method includes the determination of at least one imaging error which occurs in producing the image of the projection pattern on the substrate. A measurement image is registered which is generated through at least a major part of the optical elements of the optical element group by projecting at least a part of the projection pattern and/or at least one measurement element which is arranged in the area of the projection pattern. The imaging errors are then determined through the use of the measurement image.

Finally, a further subject addressed by the present invention is a method for the determination of an imaging error which occurs in the projection of an image of a projection pattern onto a substrate by means of the optical elements of an optical element group, in particular for use in microlithography. A measurement image is captured which is generated through at least a major part of the optical elements of the optical element group by projecting at least a part of the projection pattern and/or at least one measurement element which is arranged in the area of the projection pattern. The imaging errors are again determined through the use of the measurement image.

Further preferred embodiments of the invention are presented in the subordinate claims and in the following description of examples of preferred embodiments wherein the attach drawings are being referred to.

DETAILED DESCRIPTION OF THE INVENTION

In the following, a preferred embodiment of the optical imaging device for microlithography applications is described, making reference to FIGS. 1 to 3.

Figure 1:
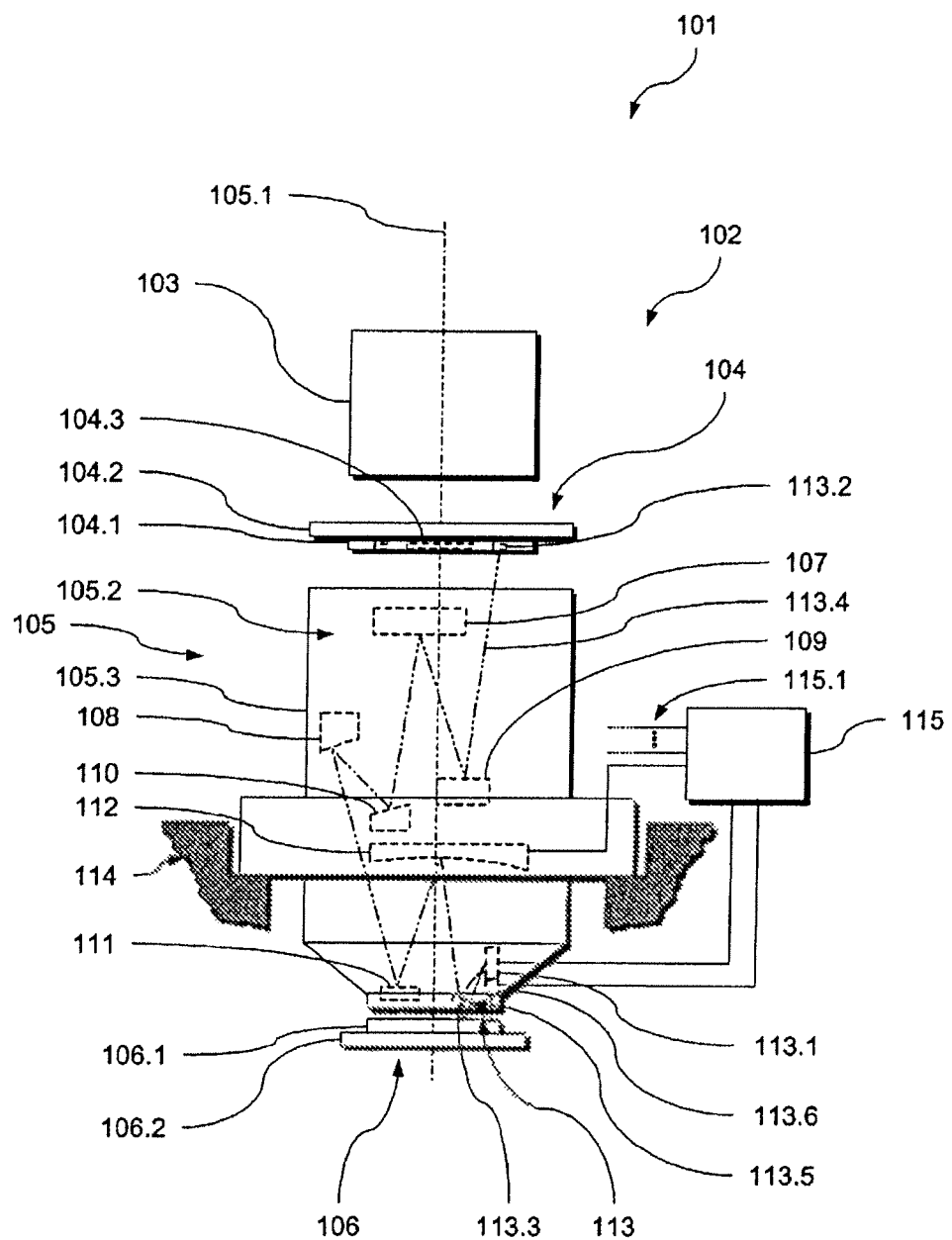
FIG. 1 represents a schematic illustration of a preferred embodiment of the optical imaging device according to the invention with a preferred embodiment of the mask according to the invention.

FIG. 1 shows a schematic representation of a preferred embodiment of the optical imaging device according to the invention in the form of a microlithography device 101 which operates with light of a first wavelength in the extreme UV range (EUV). The microlithography device 101 includes an optical projection system 102 with an illumination system 103, a mask 104, and an optical device in the form of an objective 105 with an optical axis 105.1. The illumination system 103 illuminates by way of a suitable light-conducting system (not shown in the drawing) the reflective mask 104.1 of a mask device 104 with a projection light bundle (not shown in the drawing). On the mask 104.1 which is arranged on a mask table 104.2, there is a projection pattern 104.3 which is projected with the projection light bundle by way of the optical elements in the objective 105 onto a substrate 106.1, for example a wafer on a substrate device 106.

The objective 105 includes an optical element group 105.2 which is constituted by a number of first optical elements 107, 108, 109, 110, 111, 112, which are supported in the housing 105.3 of the objective 105. As the operating wavelength is in the EUV range (approx. 13 nm), the optical elements 107, 108, 109, 110, 111, 112 are reflective optical elements, i.e. mirrors or similar elements.

There is further a measuring device 113, which includes a detection unit in the form of an encoder 113.1 attached to the housing 105.3 of the objective 105, several measurement elements 113.2 arranged in the area of the mask device 104, and a guiding device 113.3 attached to the housing 105.3 of the objective 105. The encoder 113.1 registers a measurement image of the measurement elements 113.2 which, as indicated in FIG. 1 by the ray path 113.4 of a measurement light bundle, is directed through all optical elements 107, 108, 109, 110, 111, 112 and the guiding device 113.3 to the encoder 113.1. The detection occurs here for a second wavelength of the measurement light bundle which is different from the first wavelength of the projection light bundle which serves to project the projection pattern 104.3 onto the wafer, wherein said second wavelength is optimized for the maximum sensitivity of the encoder 113.1. However, it should be understood that in other variants of the invention, the detection of the measurement image can also be performed with the wavelength used for projecting the projection pattern onto the wafer. In particular, the measurement light bundle can in this case be branched off from the projection light bundle through suitable means.

The guiding device 113.3 in the present example is a direction-changing mirror which is attached to the housing 105.3 of the objective 105 in the vicinity of the wafer 106.1. This arrangement allows the encoder 113.1 to be arranged in the housing 105.3 of the objective 105 in a location that is advantageous in regard to the installation of the encoder, its accessibility and/or the design freedom of other components. It should be understood however, that other variants of the invention can also have a differently configured guiding device. In particular, it is also possible that the substrate, if it is given the required reflective properties, would function at least as a part of the guiding device, as indicated in FIG. 1 by the dotted ray path 113.5. In this case, it may be possible to omit a guiding device which would create an obscuration for the projection of the projection pattern on the wafer.

The measuring device 113 further includes a position-determining device in the form of a reference-measuring device 113.6 which is arranged on the housing 105.3 of the objective 105 in the immediate proximity of the encoder 113.1. This reference-measuring device 113.6 serves in a conventional manner to determine the relative position of the wafer 106.1 in reference to the encoder 113.1.

In other words, the housing 105.3 of the objective 105 thus represents a reference element, in relation to which the aforementioned measurements are performed. However, it should be understood, that in other variants of the invention other components of the imaging device could serve as reference element. For example, the supporting structure 114 for the housing 105.3 of the objective 105, which is often referred to as metrology frame, can function as reference element. Likewise, one of the optical elements 107, 108, 109, 110, 111, 112 can also constitute the reference element. Particularly suitable for this purpose are heavy mirrors or similar elements which are arranged in the proximity of the substrate. Finally, the substrate device itself, for example the substrate table, can constitute the reference element, for example by arranging the encoder on the substrate table.

It should further be understood that the measurement image of the measurement elements in other variants of the invention could also be directed through only a major part of the optical elements of the element group, so that a few of the optical elements, for example at the end of the light path, could be bypassed. This is possible especially in a case where the bypassed optical element is sufficiently stable in regard to its position and thermal properties and/or if this optical element itself constitutes the reference element.

From the measurement image and from the position of the wafer 106.1 in relation to the encoder 113.1 as determined with the reference-measuring device 113.6, it is possible to determine in real time the one or more imaging errors in the projection of the projection pattern 104.3 onto the wafer 106.1. Thus, based on an observed deviation of the measurement image in the encoder 113.1 from a target condition, one can draw conclusions in regard to a deviation of the image of the projection pattern 104.3 on the wafer 106.1 from the target position and/or from the target geometry.

Thus, based on position deviations that are found by way of the measurement image, it is possible to draw conclusions about the positions of the components which participate in the projection of the projection pattern 104.3 onto the wafer 106.1, while deviations of the geometry which are found through the measurement image allow conclusions to be drawn about further imaging errors in the projection of the projection pattern 104.3 onto the wafer 106.1.

Figure 2:
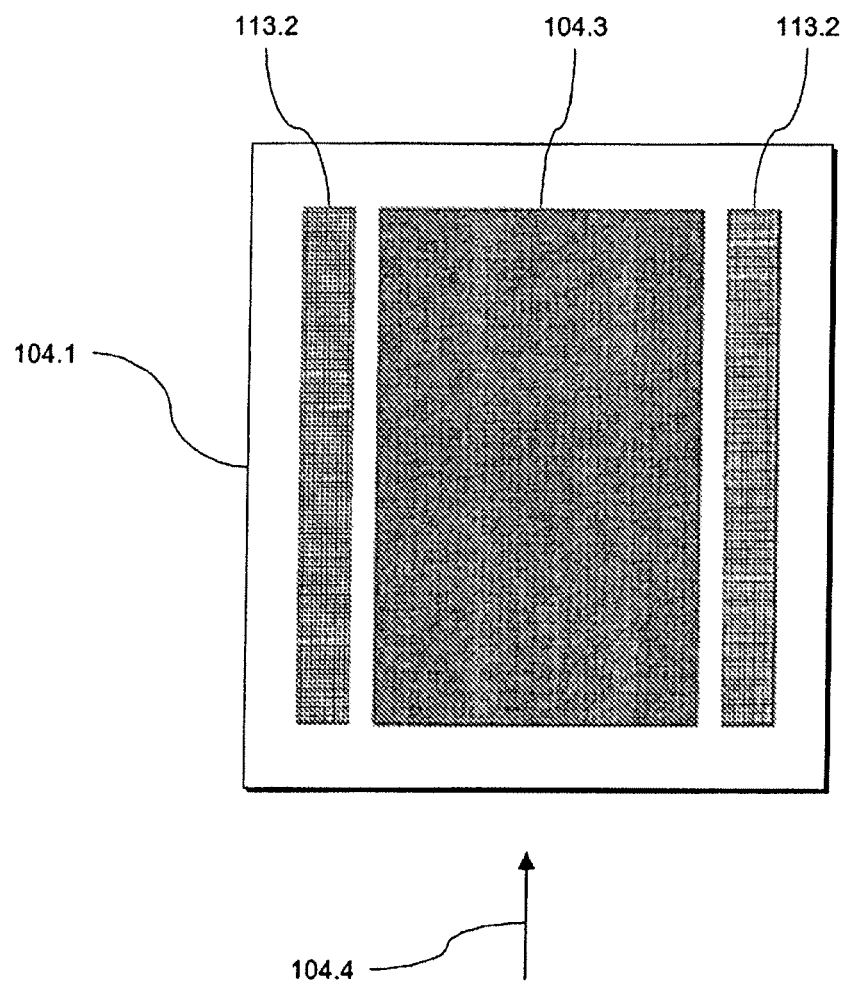
FIG. 2 represents a schematic view of the mask of FIG. 1.

As can be seen in FIG. 2, the measurement elements 113.2 in the present example are two measurement patterns in the form of two-dimensional grids which are arranged on the mask 104.1 immediately beside the projection pattern 104.3 and which extend along the scanning direction 104.4 of the mask device 104. The two-dimensional grids 113.2 can have been put on the mask 104.1 for example through a suitable simple photographic exposure process or the like. This can possibly be accomplished at the same time and/or with the same process by which the projection pattern 104.3 is produced.

With such two-dimensional grids 113.2, it is particularly simple to register the position deviations described above, because with the grid geometry being known, the encoder 113.1 (possibly after an appropriate calibration) only needs to register and count the pulses resulting from the displacement of the measurement image of the grid 113.2 in order to establish the position deviation.

Furthermore, the encoder 113.1 can also register deviations in the geometry of the measurement image of the grid 113.2, for example a distortion of the grid 113.2, and draw conclusions from those deviations in regard to further imaging errors in the projection of the projection pattern 104.3 onto the wafer 106.1.

It should be understood in this context that it would also be possible in other variants of the invention to use at least two one-dimensional grids of different orientation instead of the two-dimensional grid. As should further be understood, it would also be possible in other variants of the invention to use instead of the grids 113.2 any other measurement elements and/or instead of the encoders 113.1 any other detection units which allow the detection of the position deviation and/or of further imaging errors based on the measurement image.

It should further be understood that the one or more measurement elements in other variants of the invention need not be arranged directly at the mask. Rather, it is for example also possible to arrange the one or more measurement elements separately from the mask device in the proximity of the mask or of the projection pattern, if a defined spatial relationship to the mask or to the projection pattern is assured.

The use of passive measurement elements 113.2 arranged directly at the mask 104.1 has the advantage that without special measures, they have a defined and stable position relative to the mask 104.1 and to the projection pattern 104.3 of the mask. Unlike the laser pointer methods known from the prior art where the active light source has to be appropriately defined and held in a stable position, the measures required for this purpose under the inventive concept are only of a minor scope.

The concept of capturing the measurement image and thus among other things the position of the mask 104.1 directly at a location in the immediate proximity of the wafer 106.1 has a number of advantages. For example, any measurement errors (position errors, dynamic errors, thermal errors, etc.) which originate from the optical elements 107, 108, 109, 110, 111, 112, from the mask device 104, the substrate device 106 and the supporting structure 114 are removed. The measurement image which is registered in this way in most cases represents with good approximation the actual image of the projection pattern 104.3 on the wafer 106.1, so that an appropriate correction can be made on this basis, as will be explained in detail in the following. The deviation of the measurement image detecting position, i.e. the position of the encoder 113.1, from the substrate position, i.e. the position of the wafer 106.1, is determined and taken into account through the reference measurement performed by the reference-measuring device 113.5. Furthermore and besides, it is also possible with this arrangement to correct any enlargement error of the optical element group as well as any scale error of further reference measurement systems automatically, possibly in a single step.

The correction of the imaging errors determined by the encoder 113.1 is effected by way of a correction device in the form of a control device 115 that is connected to the measuring device 113. The control device 115 as a central control device is connected to the active components that participate in the projection of the projection pattern 104.3 onto the wafer 106.1, as illustrated in FIG. 1 by the control lines 115.1, which are in part only symbolically indicated. Of course, the connections to the active components do not necessarily have to be permanent hard-wired connections. Rather, these communications can also at least in some sections be wireless connections which may exist only temporarily.

The control device 115 processes the imaging errors determined by the encoder 113.1 and, based on said imaging errors, calculates commands for the actuator elements of one of the active components participating in the projection of the projection pattern 104.3 onto the wafer 106.1. This active component is in the present example the last optical element 112 in the light path of the projection of the projection pattern 104.3 onto the wafer 106.1.

However, it should be clear that in other variants of the invention, one or more other components that participate in the projection of the projection pattern 104.3 onto the wafer 106.1 can be configured as active components and can be used for the correction of the imaging errors that were determined. Preferably such a component is controllable within a large bandwidth. It is also possible that the controllable component is constituted by the substrate device itself.

It should further be understood that the control commands for the actuator elements of the active components that participate in the projection of the projection patterns 104.3 onto the wafer 106.1 can also be determined in other ways. For example, these commands can be taken directly from pertinent look-up tables and/or other models that are stored in memory.

Figure 3:
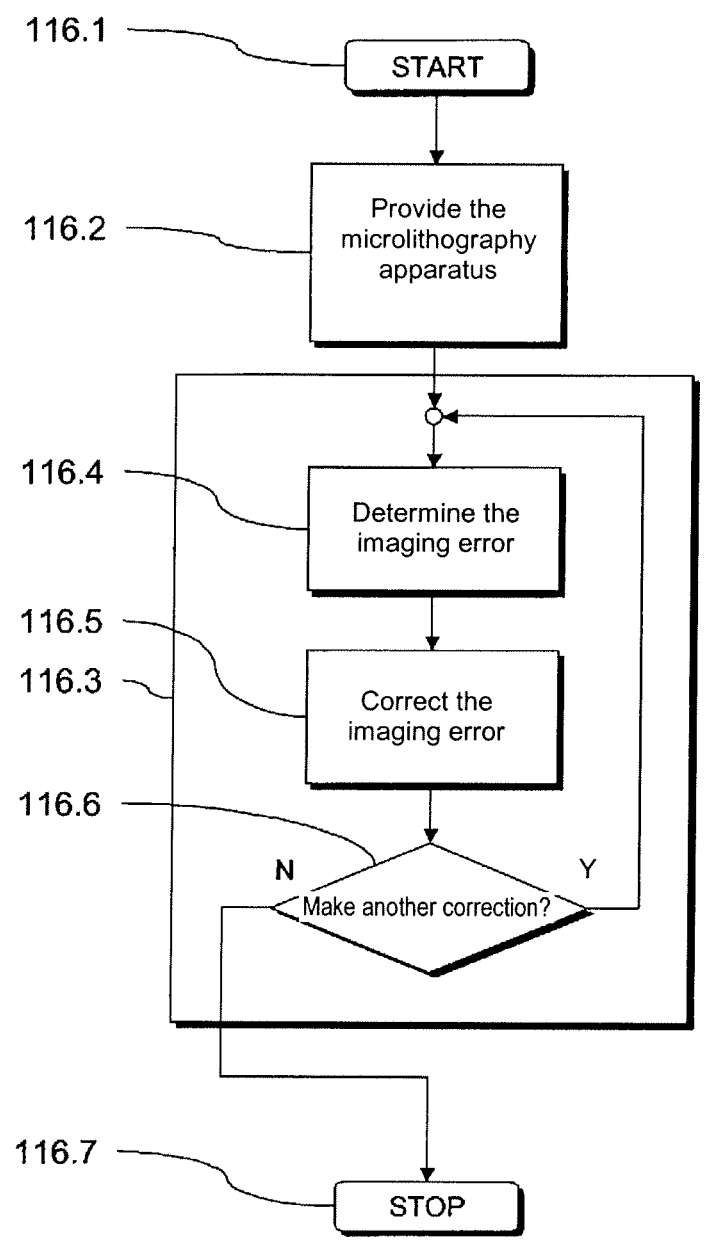
FIG. 3 represents a flowchart of a preferred embodiment of the imaging method according to the invention, using the imaging device of FIG. 1, wherein a preferred embodiment of the method according to the invention is used to detect imaging errors.

FIG. 3 shows a flowchart diagram of a preferred embodiment of the imaging method according to the invention, consisting of a microlithography method which is performed with the microlithography device 101 of FIGS. 1 and 2, which operates according to the so-called scanner principle and wherein a preferred embodiment of the method for determining the imaging error is being used.

First, the process sequence of the microlithography method is started in a step 116.1. Next, the microlithography device 101 of FIG. 1 is made available for the process in a step 116.2.

In an imaging phase 116.3, a determination of the imaging error occurs in a step 116.4 in parallel with the exposure of the wafer 106.1. As described above in the context of FIGS. 1 and 2, the measurement image of the two-dimensional grid 113.2 is measured by the encoder 113.1 and the reference measurement is performed by the reference-measuring device 113.6, and the results are processed by a processing unit of the measuring device 113 which is for example integrated in the encoder 113.1.

Dependent on the imaging errors in the projection of the projection pattern 104.3 onto the wafer 106.1 which are determined in the foregoing step 116.4 the correction of the imaging error as described above in the context of FIGS. 1 and 2 is performed in step 116.5 by the control device 115 by sending appropriate commands to the actuating elements of the optical element 112.

As mentioned, the determination and correction of the imaging error is performed in parallel with the exposure of the wafer 106.1. At least as long as no imaging errors are found which would make it necessary to stop the exposure of the wafer 106.1, the exposure occurs thus simultaneously with, and independently of, the determination and correction of the imaging error.

A further step 116.6 consists of a test as to whether a further correction cycle needs to be performed. If this is not the case, the process sequence is terminated in step 116.7. Otherwise, the process loops back to step 116.4.

Figure 4:
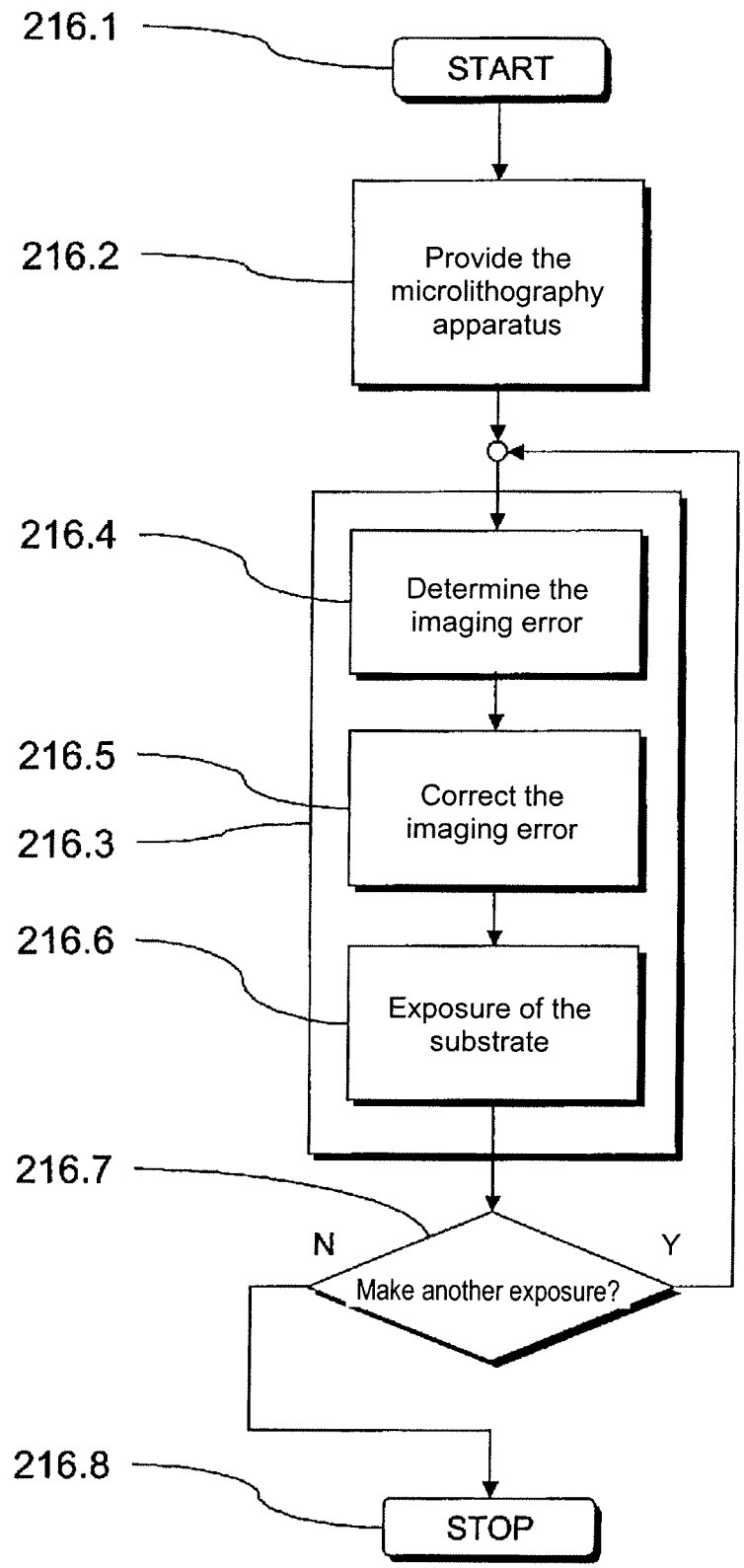
FIG. 4 represents a flowchart of a further preferred embodiment of the imaging method according to the invention, wherein a further preferred embodiment of the method according to the invention is used to detect imaging errors.

FIG. 4 shows a flowchart diagram of a further preferred embodiment of the imaging method according to the invention, consisting of a microlithography process, which is performed with the microlithography device of FIGS. 1 and 2 which in this case operates according to the so-called stepper principle and wherein a preferred embodiment of the method for the determination of the imaging error is being used.

First, the process sequence of the microlithography method is started in a step 216.1. Next, the microlithography device 101 of FIG. 1 is made available for the process in a step 216.2.

In an imaging phase 216.3, a determination of the imaging error occurs in a step 216.4. As described above in the context of FIGS. 1 and 2, the measurement image of the two-dimensional grid 113.2 is measured by the encoder 113.1 and the reference measurement is performed by the reference-measuring device 113.6, and the results are processed by a processing unit of the measuring device 113 which is for example integrated in the encoder 113.1.

Dependent on the imaging errors in the projection of the projection pattern 104.3 onto the wafer 106.1 which are determined in the foregoing step 216.4, the correction of the imaging error as described above in the context of FIGS. 1 and 2 is performed in step 216.5 by the control device 115 by sending appropriate commands to the actuating elements of the optical element 112.

In a further step 216.6 the wafer 106.1 is exposed. The next-following step 216.7 consists of a test as to whether a further exposure cycle needs to be performed. If this is not the case, the process sequence is terminated in step 216.8. Otherwise, the process loops back to repeat the phase 216.3.

In further variants of the invention, the measurement image is not—or not exclusively—produced by way of the first optical elements 107, 108, 109, 110, 111, 112, but at least in part through a group of second optical elements, one or more of which are operatively connected to one of the first optical elements 107, 108, 109, 110, 111, 112. Such a second optical element can for this purpose be, e.g., rigidly connected to the respective first optical element 107, 108, 109, 110, 111, 112, so that a correlation is known or can be sufficiently well determined or estimated between the status changes (for example position changes) of the respective first optical element 107, 108, 109, 110, 111, 112 and the second optical element that is connected to it.

The second optical elements can be constituted—possibly depending on the wavelength of the measurement light bundle—by refractive, reflective, or diffractive optical elements used either exclusively or in any combination.

It is further considered to be clear that the concept of a measurement image is not limited to a projection of separate measurement elements. Rather, it can also be envisioned that the measurement image consists either entirely or in part of an image generated by means of the measurement light bundle of at least a part of the projection pattern 104.3. The projection pattern 104.3 normally also has a sufficiently known and measurable structure, so that from its image which is projected by means of the measurement light bundle the imaging error can be determined with sufficient accuracy.

The present invention has been described hereinabove through examples in which the optical element group consists exclusively of reflective optical elements. However, it should be noted at this point that the invention can of course also find application for optical element groups which alone or in any combination include refractive, reflective or diffractive optical elements, in particular in a case of a projection with different first wavelengths.

It further needs to be noted that the present invention has been described hereinabove through an example taken from the realm of microlithography. It should, however, be understood that the present invention can likewise be used for any other applications or imaging processes.

The invention claimed is:

1. A system, comprising:
    an optical element group comprising a plurality of optical elements configured to project a projection pattern formed on an object located in an object plane onto a substrate located in an image plane; and
    a unit configured to detect a measurement image selected from the group consisting of an image of at least part of the projection pattern, and an image of a measurement element arranged in the area of the object,
    wherein:
        the measurement image is created via at least some of the optical elements in the optical element group,
        the unit is configured so that during use of the system, concurrently with the projection of the pattern onto the substrate, the unit detects the measurement image and determines an imaging error in the projection of the projection pattern onto the substrate based on the measurement image, and
        the system is configured to be used in microlithography.

2. The system of claim 1, further comprising the object.

3. The system of claim 2, wherein the object is a mask device.

4. The system of claim 1, further comprising a device configured to hold a substrate device, wherein the device is positioned in the image plane.

5. The system of claim 4, further comprising the object, wherein the object is a mask device.

6. The system of claim 1, wherein the unit is configured to determine a deviation of an actual position of the image of the object in the image plane from a target position of the image of the object in the image plane.

7. The system of claim 1, wherein the measurement image is created via all the optical elements in the optical element group.

8. The system of claim 1, further comprising a measurement element arranged adjacent the object, wherein the unit is configured to detected an image of the measurement element.

9. The system of claim 1, further comprising the object and a measurement element, wherein the object is a mask device, and the measurement element is arranged at the mask device.

10. The system of claim 1, further comprising a measurement element adjacent to a projection pattern of the object.

11. The system of claim 1, further comprising a measurement element including at least one measurement pattern.

12. The system of claim 11, wherein the measurement pattern comprises at least one two-dimensional grid.

13. The system of claim 1, wherein the unit is arranged in the area of the image plane.

14. The system of claim 1, further comprising an optical guiding device configured to guide the measurement image to the unit, the optical guiding device being adjacent the image plane.

15. The system of claim 14, further comprising a device configured to hold a substrate device and the substrate device, wherein the optical guiding device is formed by a surface of the substrate device.

16. The system of claim 1, further comprising a reference element and a position-determining device, wherein the unit is arranged at the reference element, and the position-determining device is configured to determine a position of the image plane relative to the unit.

17. The system of claim 16, wherein the reference element is configured to support at least one optical element of the optical element group.

18. The system of claim 1, wherein the system is configured so that during use light of a first wavelength is used to project the image of the object into the image plane, light of a second wavelength is used to generate the measurement image, and the first wavelength is different from the second wavelength.

19. The system of claim 18, wherein the second wavelength is adapted to the unit to optimize the sensitivity of the unit.

20. The system of claim 18, wherein the first wavelength is in the EUV range.

21. The system of claim 1, further comprising a correction unit connected to the unit, wherein at least one of the components of the system that participates in projecting an image of the object to the image plane is an actively controllable component, the actively controllable component is connectable to the correction unit, and the correction unit is configured to be capable to control the actively controllable component based on the imaging error.

22. The system of claim 21, further comprising a mask device and a substrate device, wherein the actively controllable component is a component of a mask device, an optical element of the optical element group, or a component of the substrate device.

23. The system of claim 1, further comprising an illumination system configured to illuminate the object during use of the system.

24. The system of claim 23, further comprising the object, wherein the object is a mask device.

25. The system of claim 23, wherein the measurement image is an image of a measurement element arranged in the area of the object.

26. The system of claim 1, wherein the measurement image is selected an image of at least part of the projection pattern.

27. A method, comprising:
projecting an image of a pattern onto a substrate via optical elements of an optical element group in a microlithography system;
concurrently with projecting the pattern onto the substrate, detecting a measurement image of at least a part of the pattern and/or of at least one measurement element which is arranged in the area of the pattern, the measurement image being generated via at least some of the optical elements of the optical element group; and
based on the detected measurement image and concurrently with projecting the pattern, determining an imaging error which occurs in projecting the image of the pattern onto the substrate.

28. A method, comprising:
projecting an image of a pattern onto a substrate via optical elements of an optical element group in a microlithography system;
concurrently with projecting the pattern onto the substrate, registering a measurement image of at least a part of the pattern and/or of at least one measurement element arranged in the area of the pattern, the measurement image being generated via at least some of the optical elements of the optical element group; and
concurrently with projecting the pattern onto the substrate, determining an imaging error based on the measurement image.

* * * * *